United States Patent
Rossman

(10) Patent No.: US 6,846,742 B2
(45) Date of Patent: Jan. 25, 2005

(54) SI SEASONING TO REDUCE PARTICLES, EXTEND CLEAN FREQUENCY, BLOCK MOBILE IONS AND INCREASE CHAMBER THROUGHPUT

(75) Inventor: Kent Rossman, Orlando, FL (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 10/463,703

(22) Filed: Jun. 16, 2003

(65) Prior Publication Data

US 2003/0211735 A1 Nov. 13, 2003

Related U.S. Application Data

(63) Continuation of application No. 09/780,800, filed on Feb. 8, 2001, now Pat. No. 6,589,868.

(51) Int. Cl.[7] ............................................. H01L 21/44
(52) U.S. Cl. ................ 438/680; 438/311; 438/905; 438/913; 427/452; 427/567; 427/585; 427/588; 427/723; 113/11
(58) Field of Search ................................ 438/680, 311, 438/905, 913; 427/452, 567, 585–588; 134/11

(56) References Cited

U.S. PATENT DOCUMENTS

| | | | |
|---|---|---|---|
| 4,940,505 A | | 7/1990 | Schachameyer et al. |
| 5,218,225 A | | 6/1993 | Zanders |
| 5,647,953 A | | 7/1997 | Williams et al. |
| 5,798,016 A | * | 8/1998 | Oehrlein et al. ........ 156/345.37 |
| 5,861,601 A | * | 1/1999 | Sato et al. ............. 219/121.43 |
| 6,093,660 A | | 7/2000 | Jang et al. |
| 6,121,161 A | | 9/2000 | Rossman et al. |
| 6,139,983 A | | 10/2000 | Ohashi et al. |
| 6,217,724 B1 | | 4/2001 | Chu et al. |
| 6,223,685 B1 | | 5/2001 | Gupta et al. |
| 6,350,427 B1 | | 2/2002 | Yuill et al. |
| 6,365,225 B1 | | 4/2002 | Chandra et al. |
| 6,383,942 B1 | | 5/2002 | Narita et al. |
| 6,413,321 B1 | * | 7/2002 | Kim et al. .................. 118/725 |
| 6,413,871 B2 | | 7/2002 | M'Saad et al. |
| 6,417,126 B1 | | 7/2002 | Yang |
| 6,589,868 B2 | * | 7/2003 | Rossman ..................... 438/680 |
| 6,624,064 B1 | * | 9/2003 | Sahin et al. ................ 438/627 |

FOREIGN PATENT DOCUMENTS

| | | |
|---|---|---|
| EP | 0892083 A1 | 1/1999 |
| GB | 2311299 A | 9/1997 |
| JP | 58-92218 | 6/1983 |
| JP | 3-41978 | 6/1991 |
| JP | 3-278536 | 12/1991 |
| JP | 11-067746 | 10/1999 |
| JP | p2001-12861 A | 1/2001 |

* cited by examiner

Primary Examiner—Matthew Smith
Assistant Examiner—Granvill D. Lee, Jr.
(74) Attorney, Agent, or Firm—Townsend & Townsend & Crew

(57) ABSTRACT

Embodiments of the present invention include a method of depositing an improved seasoning film. In one embodiment the method includes, prior to performing a substrate processing operation, forming a layer of silicon over an interior surface of the substrate processing chamber as opposed to a layer of silicon oxide. In certain embodiments, the layer of silicon comprises at least 70% atomic silicon, is deposited from a high density silane ($Si_nH_{2n+2}$) process gas and/or is deposited from a plasma having a density of at least $1 \times 10^{11}$ ions/cm$^3$.

10 Claims, 7 Drawing Sheets

US 6,846,742 B2

SI SEASONING TO REDUCE PARTICLES, EXTEND CLEAN FREQUENCY, BLOCK MOBILE IONS AND INCREASE CHAMBER THROUGHPUT

CROSS-REFERENCES TO RELATED APPLICATIONS

This application is a continuation of U.S. application Ser. No. 09/780,800, filed Feb. 8, 2001 now U.S. Pat. No. 6,589,868, entitled "Si Seasoning to Reduce Particles, Extend Clean Frequency, Block Mobile Ions and Increase Chamber Throughput," having Kent Rossman listed as inventors. The Ser. No. 09/780,800 application is assigned to Applied Materials, Inc., the assignee of the present invention and is hereby incorporated by reference.

BACKGROUND OF THE INVENTION

During chemical vapor deposition (CVD) of silicon oxide and other layers onto the surface of a substrate, the deposition gases released inside the processing chamber may cause unwanted deposition on areas such as the walls of the processing chamber. Unless removed, this unwanted deposition is a source of particles that may interfere with subsequent processing steps and adversely effect wafer yield.

To avoid such problems, the inside surface of the chamber is regularly cleaned to remove the unwanted deposition material from the chamber walls and similar areas of the processing chamber. This procedure is performed as a standard chamber dry clean operation where an etchant gas, such as nitrogen trifluoride ($NF_3$), is used to remove (etch) the deposited material from the chamber walls and other areas. During the dry clean operation, the chamber interior is exposed to products formed by a plasma of the etchant gas which reacts with and removes the deposited material from the chamber walls. Such cleaning procedures are commonly performed between deposition steps for every wafer or every n wafers.

The clean step can, in itself, be a source of particle accumulation, however. Fluorine from the clean plasma can be absorbed and/or trapped in the chamber walls and in other areas of the chamber such as areas that include ceramic lining or other insulation material. The trapped fluorine can be released during subsequent processing steps (e.g., by reacting with constituents from the plasma in a high density plasma CVD (HDP-CVD) step) and can be absorbed in subsequently deposited silicon oxide or other layers.

To prevent such fluorine release and to provide protection against other contaminants within the chamber walls, e.g., the diffusion of sodium, aluminum, and other contaminants, a CVD chamber is often "seasoned" after the dry clean operation. Typically, seasoning includes depositing a thin silicon oxide layer over the chamber walls before a substrate is introduced into the chamber for processing. The deposited silicon oxide layer covers the chamber walls reducing the likelihood that contaminates will interfere with subsequent processing steps. After deposition of the seasoning layer is complete, the chamber is used for one to n substrate deposition steps before being cleaned in another clean operation as described above and then reseasoned.

Semiconductor device geometries have dramatically decreased in size since such devices were first introduced several decades ago. In order to achieve such decreased devices sizes and increased integration density, new and modified deposition and etch processes have been developed by the semiconductor industry. In some instances, procedures used with prior technology do not provide optimal results with new technology. Accordingly, new techniques for working with such new technology are continuously being sought including improved processes to deposit seasoning films.

SUMMARY OF THE INVENTION

Embodiments of the present invention include a method of depositing an improved seasoning film. In one embodiment the method includes, prior to performing a substrate processing operation, forming a layer of silicon over an interior surface of the substrate processing chamber as opposed to a layer of silicon oxide. In certain embodiments, the layer of silicon comprises at least 70% atomic silicon, is deposited from a silane ($Si_nH_{2n+2}$) process gas and/or is deposited from a high density plasma having a density of at least $1 \times 10^{11}$ ions/cm$^3$.

These and other embodiments of the present invention, as well as its advantages and features, are described in more detail in conjunction with the text below and attached figures.

DESCRIPTION OF THE SPECIFIC EMBODIMENTS

As mentioned above, a common seasoning film used commercially by several semiconductor manufacturers is a silicon oxide film. One example of such a silicon oxide seasoning film that has been used in high density plasma CVD (HDP-CVD) chambers is deposited from a process gas of monosilane ($SiH_4$) and molecular oxygen ($O_2$) where the flow ratio of oxygen to silane is at least 1:1 and typically 1.3:1 or higher.

Figure 1:
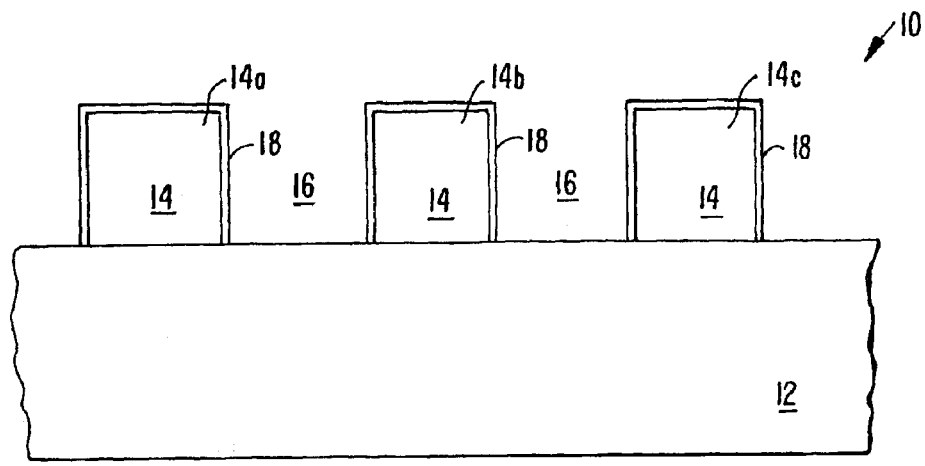
FIG. 1 is a simplified cross-sectional representation of a partially completed integrated circuit 10 prior to deposition of an intermetal dielectric layer.

The inventor has discovered that silicon oxide seasoning films such as the one just described are insufficient for some applications. Specifically, the inventor has discovered that particle counts associated with the deposition of an intermetal dielectric layer (hereinafter referred to as an "IMD layer") over aluminum lines may be unacceptably high when the chamber in which the IMD layer is deposited is lined with a silicon oxide seasoning film and an outer strata of the aluminum lines includes a thin layer of aluminum fluoride or similar residue. FIG. 1 is a simplified cross-sectional representation of a partially completed integrated circuit 10 (hereinafter referred to as "IC 10") that includes such a profile.

In FIG. 1, IC 10 includes an aluminum layer 14 deposited over a substrate 12. Although not shown, substrate 12 is typically a silicon wafer that has one or more intermediate layers formed thereon as is known to those of skill in the art. The intermediate layers typically include either premetal dielectric layers or IMD layers. IC 10 includes openings 16 etched in aluminum layer 14. Each opening 16 represents a gap between adjacent conductive traces 14a, 14b, 14c that are defined in the aluminum layer. The openings may be formed using any subtractive etch process as is well known to those of skill in the art. Depending on how openings 16 are formed, a thin layer of aluminum fluoride ($AlF_x$) residue 18 may line an outer strata of aluminum layer 14. This $AlF_x$ strata may also include contaminants such as carbon, titanium and tantalum. Typically, the $AlF_x$ strata is at least 10 Å thick and no more than 200 Å thick.

The inventor has found that when an IMD layer is deposited over an IC 10 that includes such an $AlF_x$ strata, particle contamination during the IMD deposition step is unacceptably high if a silicon oxide seasoning layer is used. While not being limited to any particular theory, it is believed that during deposition of the IMD layer, fluorine and other contaminants from the $AlF_x$ residue layer migrate from the aluminum lines and find their way into the seasoning film. Such contaminants may then migrate from the silicon oxide layer to the chamber walls adversely affecting the adhesion of the layer to the wall. This in turn results in unacceptably high particle counts as well as a significant slow down in the chamber clean time after deposition of the IMD layer.

The inventor solved this problem by developing an improved seasoning layer. The improved layer comprises a silicon film as opposed to a silicon oxide film. The silicon layer is better than a silicon oxide layer in blocking mobile ions including, among others, sodium, fluorine, lithium, phosphorus and potassium. The silicon in the layer also includes SP3 hybridized bonds as opposed to SP hybridized bonds of oxygen. It is believed that this allows silicon atoms in the layer to getter fluorine out of the $AlF_x$ residue to form gaseous $SiF_4$ which can be pumped out of the deposition chamber. Thus, less fluorine is absorbed in the seasoning layer and any absorbed fluorine is prevented from reaching the interior chamber surface.

In one embodiment the improved seasoning layer is a silicon film while in another embodiment the improved seasoning layer is a multilayer film having a silicon oxide layer and a silicon layer. Further details of the seasoning film of the present invention are included below as well as comparative examples and test results comparing the effectiveness of the seasoning film of the invention to previously known seasoning films.

In one embodiment of the invention, a silicon seasoning film is formed from a plasma of a silane gas ($Si_nH_{2n+2}$) and an inert gas (e.g., argon) in an HDP-CVD chamber, such as chamber 100 described later in this application. The silicon seasoning film is deposited over interior surfaces of the HDP-CVD chamber when a substrate is not present within the chamber. As used herein, a "substrate" refers to a silicon or similar wafer in which integrated circuits are to be formed.

It is generally desirable that the silicon seasoning film include a low hydrogen content and high silicon content. In one embodiment, the silicon seasoning film includes at least 70% atomic silicon and more preferably includes at least 80% atomic silicon. The inventor has found that film adhesion is improved when hydrogen content is low (silicon content high). Generally, increasing the RF source power, lowering the deposition temperature, lowering the deposition pressure and lowering the deposition rate by reducing the silane flow all decrease the amount of hydrogen in the film. Additionally, depositing the seasoning film in a high density plasma (ion density of at least $1\times10^{11}$ ions/cm$^3$) as opposed to a lower density plasma allows a higher silicon content, and therefore lower hydrogen content, to be incorporated into the film.

Table 1 listed below includes deposition parameters for an exemplary process carried out in chamber 100 to deposit a silicon seasoning film according to this embodiment.

TABLE 1

EXEMPLARY SEASONING FILM

| Parameter | Value |
| --- | --- |
| SiH$_4$ flow (side) | 180 sccm |
| Ar flow (side) | 90 sccm |
| Ar flow (top) | 15 sccm |
| Pressure | Throttle valve fully open (approx. 9 mTorr) |
| Temperature (walls) | 70° C. |
| Temperature (dome) | 145° C. |
| Temperature (chuck) | 70° C. |
| Source RF (top) | 3500 W |
| Source RF (side) | 0 W |
| Bias RF | 0 W |

According to another embodiment of the invention, a multilayer silicon seasoning film is formed. The multilayer seasoning film includes at least one silicon layer and one silicon oxide layer. In one embodiment the silicon oxide layer is formed over the silicon layer. The resulting two layer film beneficially provides the mobile ion blocking protection of the silicon layer and presents a silicon oxide surface to the interior of the substrate processing chamber. The silicon oxide surface can act as protection against oxidizing the silicon seasoning film. This is particularly beneficial when, for example, deposition of the IMD layer in the substrate processing chamber is initiated with an oxygen plasma. Without the presence of the silicon oxide outer layer, the oxygen plasma may partially or completely oxidize the silicon seasoning film.

Table 2 listed below includes deposition parameters for an exemplary process carried out in chamber 100 to deposit such a multilayer seasoning film.

TABLE 2

EXEMPLARY SEASONING FILM

| Parameter | Step 1 Value | Step 2 Value |
|---|---|---|
| SiH$_4$ flow (side) | 180 sccm | 180 sccm |
| O$_2$ flow (side) | 0 sccm | 270 sccm |
| Ar flow (side) | 90 sccm | 90 sccm |
| Ar flow (top) | 15 sccm | 15 sccm |
| Pressure | 9 mTorr | 12 mTorr |
| Temperature (walls) | 70° C. | 70° C. |
| Temperature (dome) | 145° C. | 145° C. |
| Temperature (chuck) | 70° C. | 70° C. |
| Source RF (top) | 3500 W | 3500 W |
| Source RF (side) | 0 W | 0 W |
| Bias RF | 0 W | 0 W |

Test Results and Comparative Examples

In order to prove the effectiveness of the present invention, the inventor conducted several experiments comparing particle counts of an IMD film deposition process preceded by formation of seasoning films deposited in accordance with both the prior art and the techniques of the invention. For these tests, a seasoning layer was deposited in an Ultima HDP-CVD chamber manufactured by Applied Materials, the assignee of the present invention and then 14,000 Å thick FSG layers were deposited over one, two or three substrates as described below prior to performing a chamber clean operation. The FSG layers were deposited using identical conditions in each test using the process set forth in Table 3 below.

TABLE 3

FSG FILM PROCESS

| Parameter | Step 1 Value |
|---|---|
| SiH$_4$ flow (side) | 40 sccm |
| SiH$_4$ flow (top) | 3.5 sccm |
| O$_2$ flow (side) | 116 sccm |
| Ar flow (side) | 60 sccm |
| Ar flow (top) | 5 sccm |
| Pressure | 5 mTorr |
| Temperature (chuck) | 410° C. |
| Source RF (top) | 1200 W |
| Source RF (side) | 3000 W |
| Bias RF | 2400 W |

Figure 6:
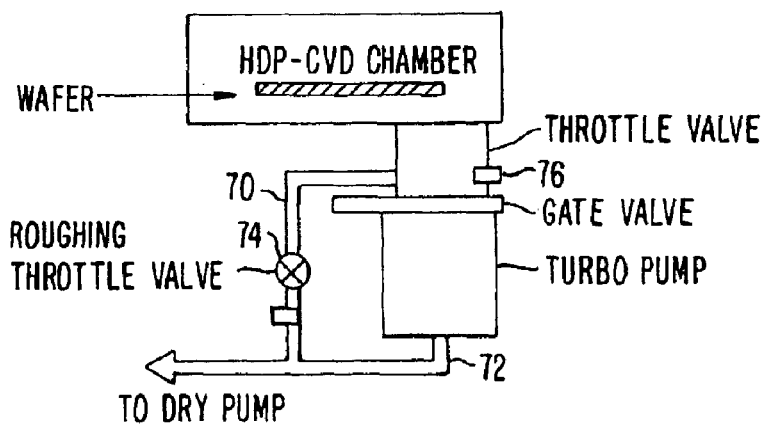
FIG. 6 is a simplified block diagram showing placement of particle measurement sensors used to detect particles for the tests depicted in FIGS. 2 and 3.

During the tests, gases exhausted from the chamber during a cleaning process were flowed through a first exhaust path 70 (see FIG. 6) while gases exhausted from the chamber during deposition and seasoning steps were flowed through a second exhaust path 72. Accordingly, two different particle sensors were used to measure the particles downstream from the chamber. A first HYT brightfield sensor 76 was positioned in path 72 of the exhaust line and used to measure particles larger than 0.30 um exhausted during the deposition and seasoning steps and an HYT darkfield sensor 74 was positioned in path 70 of the exhaust line and used to measure particles larger than 0.17 um exhausted during the chamber clean step. As shown in FIG. 6, sensor 76 was positioned between the turbo throttle valve and gate valve while the sensor 74 was positioned between the chamber rough pump and a roughing isolation valve.

Figure 2:
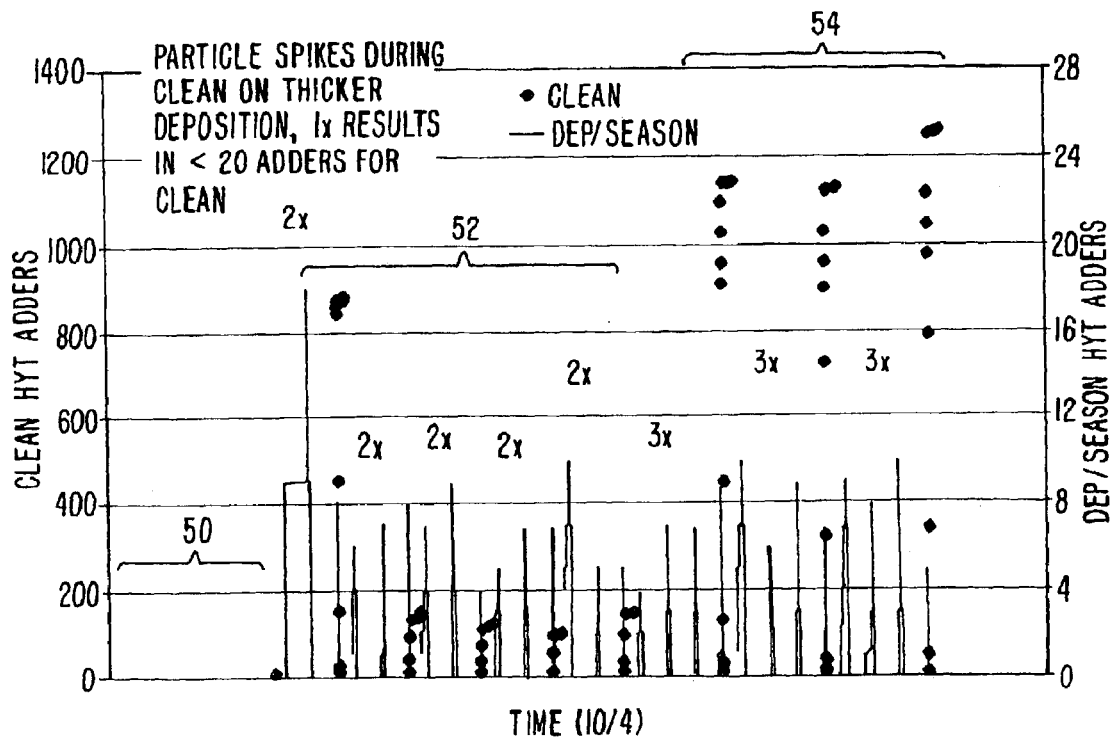
FIGS. 2 and 3 are graphs showing particles measured downstream of a deposition chamber during clean and deposition steps performed after the chamber was seasoned with a silicon oxide seasoning film deposited according to previously known techniques.

FIG. 2 is graph showing particles measured using the sensors positioned as above when the chamber was seasoned with a silicon oxide seasoning film deposited according to known techniques. The particle counts shown in FIG. 2 include particles measured during the deposition and seasoning process and during the chamber clean process. The particle measurements were taken downstream from the processing chamber. There are three different sets of particle measurements shown in FIG. 2. The first set 50 is for a process in which a single FSG layer was deposited between the seasoning and chamber cleaning steps. Set 52 is for a process in which two (n=2) FSG layers were deposited over two different wafers between the seasoning and chamber clean steps. Finally, set 54 is for a process in which three (n=3) FSG layers were deposited over three different wafers between the seasoning and chamber clean steps. Also note that in FIG. 2, the diamond bullets represent particle counts measured during the chamber clean process while the plotted lines represent particle counts measured during the deposition and seasoning process.

Figure 3:
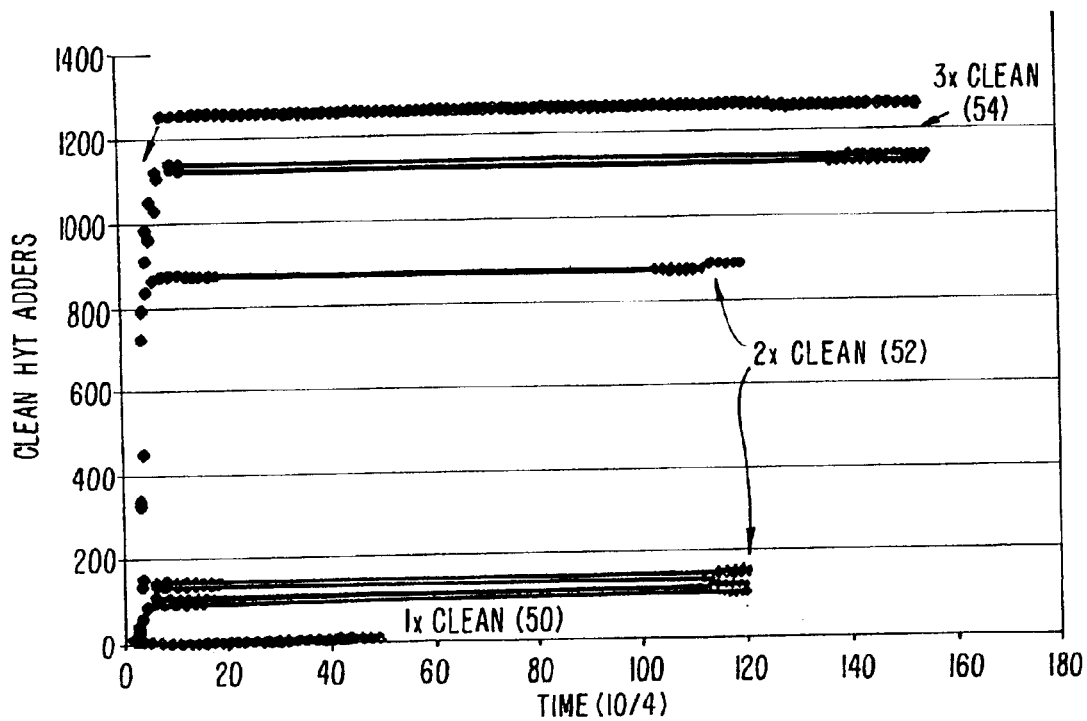

As shown in FIG. 2, particle counts for sets 52 and 54 are significantly higher than set 50. FIG. 3 shows the particle counts for the same data sets 50, 52 and 54 as measured over time. Thus, as can be appreciated by those of skill in the art, the data of FIGS. 2 and 3 shows a trend that indicates the chamber must be cleaned and reseasoned frequently in order to keep particle counts within acceptable levels.

Figure 4:
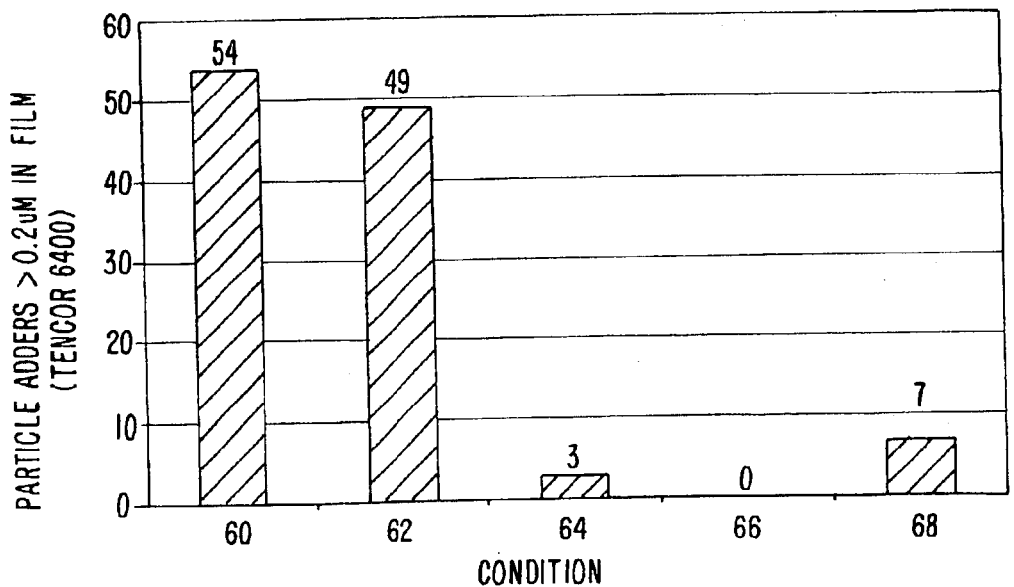
FIG. 4 is a bar graph depicting particle counts measured in FSG films (as opposed to in the chamber) subsequent to seasoning the chamber and two prior FSG film deposition steps.

FIG. 4 shows counts for particles over 0.16 um measured in FSG films (as opposed to in the chamber) after two previous FSG film deposition steps had occurred after the chamber was seasoned. In this test, particles were measured using a Tencor 6420 optical scanning surface inspection system. Particle counts in five separate FSG layers were measured. Particle counts 60 and 62 represent counts made when the chamber was seasoned with a standard silicon oxide seasoning film. Particle counts 64, 66 and 68 represent counts made when the chamber was seasoned in accordance with the present invention. Specifically, count 64 represents a count made when the chamber was seasoned with a silicon seasoning film deposited for 30 seconds using the deposition conditions shown in Table 1; count 66 represents the chamber being seasoned with a multilayer seasoning film—10 seconds of silicon deposition followed by 25 seconds of silicon oxide deposition using the deposition conditions shown in Table 2; and count 68 represents the chamber being seasoned with a multilayer seasoning film—60 seconds of silicon deposition followed by 10 seconds of silicon oxide deposition using the deposition conditions shown in Table 2.

As shown in FIG. 4, the particle counts associated with the two prior art seasoning films are considerably higher than the particle counts associated with seasoning films deposited according to the present invention (54 and 49 particles added as compared to 3, 0 and 7 particles added). Generally, manufacturing specifications set by some semiconductor manufacturers allow up to 30 particles greater than 0.16 Φm to be added to a deposited layer during a process for the process to meet specifications. Processes having particle counts above this level, however, do not meet the specifications and result in rejected wafers. Thus, when 14,000 Å FSG layers are deposited after the chamber is seasoned with a silicon oxide film it is clear that the chamber must be cleaned before a third consecutive deposition process or such manufacturer's specifications will not be met. When the chamber is seasoned according to the present invention, however, it is clear particle counts are well within the manufacturer's specifications for the third consecutive deposition process. This in turn allows for increased throughput as can be appreciated by those of skill in the art.

Figure 5:
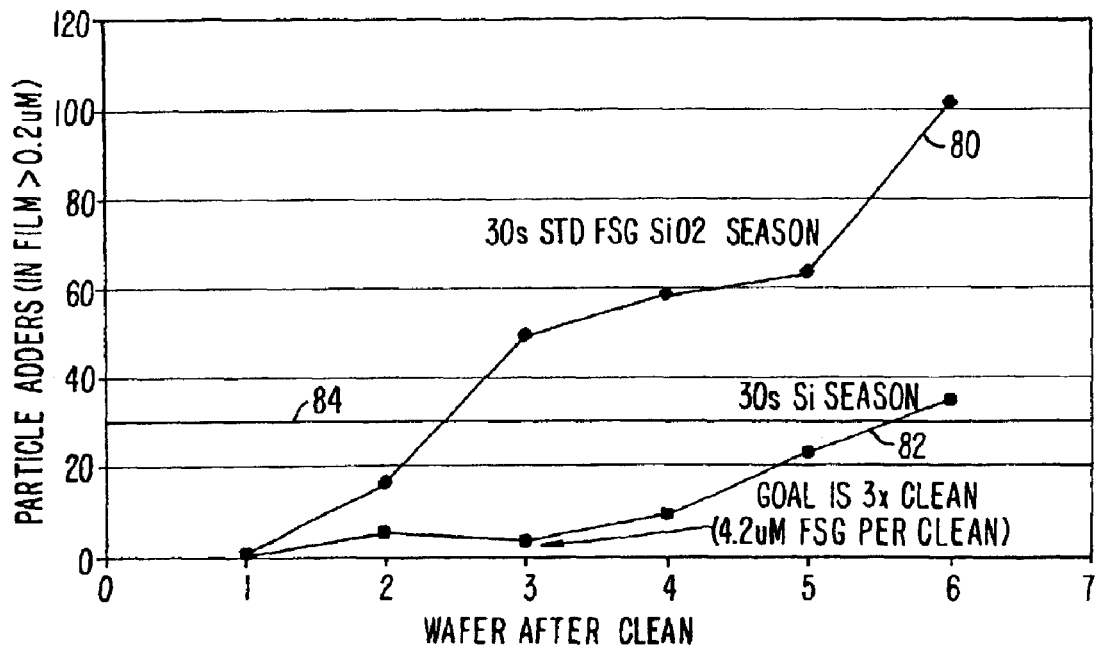
FIG. 5 is a bar graph depicting particle counts measured in FSG films (as opposed to in the chamber) subsequent to seasoning the chamber over six consecutive FSG film deposition steps.

FIG. 5 shows particle counts measured in the FSG films during another test that compares performance of a standard silicon oxide seasoning film (line 80) versus a silicon seasoning film (line 82) according to one embodiment of the present invention. For each test, the chamber was initially seasoned and then six consecutive 14,000 Å FSG deposition steps (each over a different substrate) was performed. Each of the silicon oxide and silicon seasoning film deposition steps were 30 seconds long. The FSG deposition steps were then performed without any cleaning of the chamber between the steps.

If a particular manufacturers specifications allow up to 30 particles added as in the FIG. 4 test (line 84 represents the manufacturers specification for particles added), it can be seen in FIG. 5 that when the chamber is seasoned with a standard silicon oxide film, the third FSG deposition step results in the addition of approximately 50 particles to the FSG layer. This is 20 particles above the manufacturer specification. Thus, only two FSG deposition steps can be performed before the chamber needs to be cleaned and reseasoned to keep the particle count below 30 when a silicon oxide seasoning film is used. When the chamber is seasoned with a film according to the invention, however, five FSG deposition steps can be performed before cleaning and reseasoning the chamber. Reducing the frequency of cleaning and seasoning steps provides a significant increase in the throughput of the deposition tool.

Exemplary Substrate Processing System

Figure 7A:
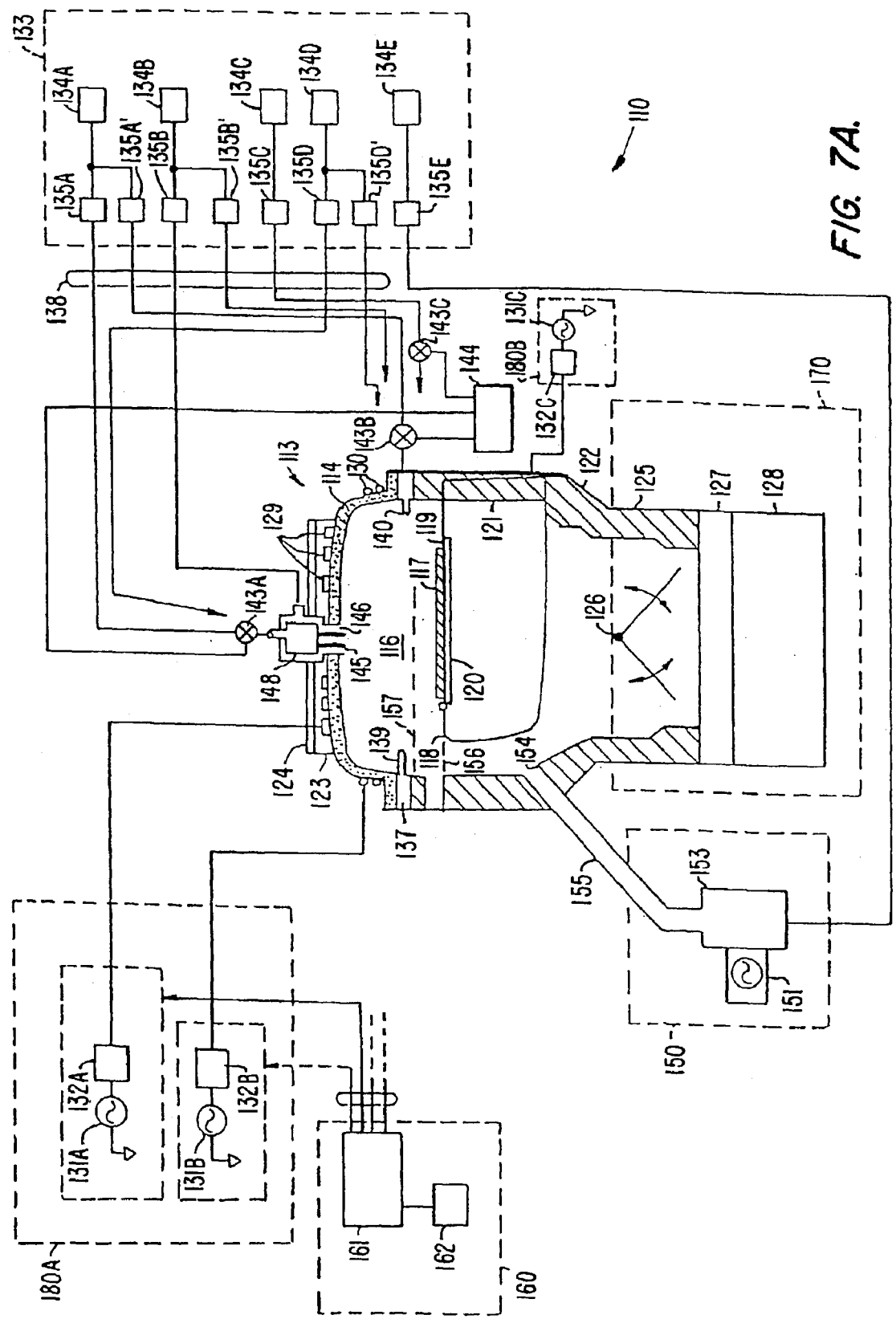
FIG. 7A is a simplified diagram of one embodiment of a high density chemical vapor deposition system according to the present invention.

The method of the present invention may be employed in a variety of substrate processing chambers. FIG. 7A illustrates one embodiment of a high density plasma chemical vapor deposition (HDP-CVD) system 110 in which a seasoning film according to the present invention can be deposited. System 110 includes a chamber 113, a vacuum system 170, a source plasma system 180A, a bias plasma system 180B, a gas delivery system 133, and a remote plasma cleaning system 150.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support member 118.

A heater plate 123 and a cold plate 124 surmount, and are thermally coupled to, dome 114. Heater plate 123 and cold plate 124 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 113 includes a body member 122, which joins the chamber to the vacuum system. A base portion 121 of substrate support member 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support member 118. Substrate receiving portion 119 includes an electrostatic chuck 120 that secures the substrate to substrate support member 118 during substrate processing. In a preferred embodiment, substrate support member 118 is made from an aluminum oxide or aluminum ceramic material.

Vacuum system 170 includes throttle body 125, which houses twin-blade throttle valve 126 and is attached to gate valve 127 and turbo-molecular pump 128. It should be noted that throttle body 125 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures from between about 1 mTorr to about 2 Torr.

The source plasma system 180A includes a top coil 129 and side coil 130, mounted on dome 114. A symmetrical ground shield (not shown) reduces electrical coupling between the coils. Top coil 129 is powered by top source RF (SRF) generator 136A, whereas side coil 130 is powered by side SRF generator 136B, allowing independent power levels and frequencies of operation for each coil. This dual coil system allows control of the radial ion density in chamber 113, thereby improving plasma uniformity. Side coil 130 and top coil 129 are typically inductively driven, which does not require a complimentary electrode. In a specific embodiment, the top source RF generator 136A provides up to 2,500 watts of RF power at nominally 2 MHz and the side source RF generator 136B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 136C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 136A and 136B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 132A and 132B match the output impedance of generators 136A and 136B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 7B:
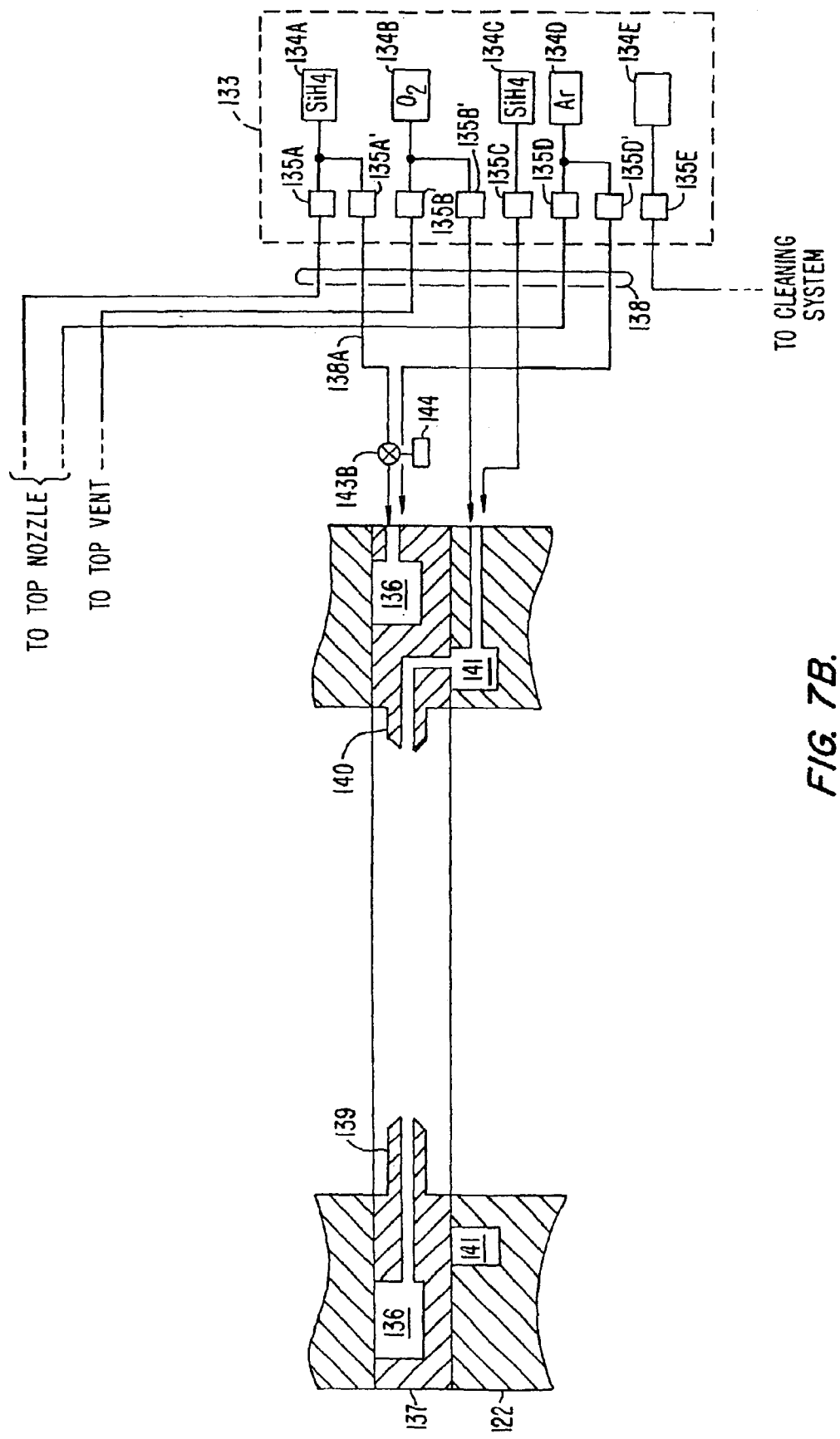
FIG. 7B is a simplified cross section of a gas ring that may be used in conjunction with the exemplary CVD processing chamber of FIG. 7A.

A gas delivery system 133 provides gases from several sources, 134A–134F chamber for processing the substrate via gas delivery lines 138 (only some of which are shown). As would be understood by a person of skill in the art, the actual sources used for sources 134A–134F and the actual connection of delivery lines 138 to chamber 113 varies depending on the deposition and cleaning processes executed within chamber 113. Gases are introduced into chamber 113 through a gas ring 137 and/or a top nozzle 145. FIG. 7B is a simplified, partial cross-sectional view of chamber 113 showing additional details of gas ring 137.

In one embodiment, first and second gas sources, 134A and 134B, and first and second gas flow controllers, 135A' and 135B', provide gas to ring plenum 136 in gas ring 137 via gas delivery lines 138 (only some of which are shown). Gas ring 137 has a plurality of gas nozzles 139 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 137 has 112 gas nozzles 139 made from an aluminum oxide ceramic.

Gas ring 137 also has a plurality of gas nozzles 140 (only one of which is shown), which in a preferred embodiment are co-planar with and shorter than source gas nozzles 139, and in one embodiment receive gas from body plenum 141. Gas nozzles 139 and 140 are not fluidly coupled in some embodiments it is desirable not to mix gases before injecting the gases into chamber 113. In other embodiments, gases may be mixed prior to injecting the gases into chamber 113 by providing apertures (not shown) between body plenum 141 and gas ring plenum 136. In one embodiment, third and fourth gas sources, 134C and 134D, and third and fourth gas flow controllers, 135C and 135D', provide gas to body plenum via gas delivery lines 138. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 143B, to isolate chamber 113 from delivery line 138A and to vent delivery line 138A to vacuum foreline 144, for example. As shown in FIG. 7A, other similar valves, such as 143A and 143C, may be incorporated on other gas delivery lines. Such 3-way valves may be placed as close to chamber 113 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 7A, chamber 113 also has top nozzle 45 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, first gas source 134A supplies source gas nozzles 139 and top nozzle 145. Source nozzle MFC 135A' controls the amount of gas delivered to source gas nozzles 139 and top nozzle MFC 135A controls the amount of gas delivered to top gas nozzle 145. Similarly, two MFCs 135B and 135B' may be used to control the flow of oxygen to both top vent 146 and oxidizer gas nozzles 140 from a single source of oxygen, such as source 134B. The gases supplied to top nozzle 145 and top vent 146 may be kept separate prior to flowing the gases into chamber 113, or the gases may be mixed in top plenum 48 before they flow into chamber 113. Separate sources of the same gas may be used to supply various portions of the chamber.

A remote microwave-generated plasma cleaning system 150 is provided to periodically clean deposition residues from chamber components. The cleaning system includes a remote microwave generator 151 that creates a plasma from a cleaning gas source 134E (e.g., molecular fluorine, nitrogen trifluoride, other fluorocarbons or equivalents) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. In a preferred embodiment, controller 160 includes a memory 162, such as a hard disk drive, a floppy disk drive (not shown), and a card rack (not shown) coupled to a processor 161. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 131 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 165, and a light pen 166, as depicted in FIG. 7C.

Figure 7C:
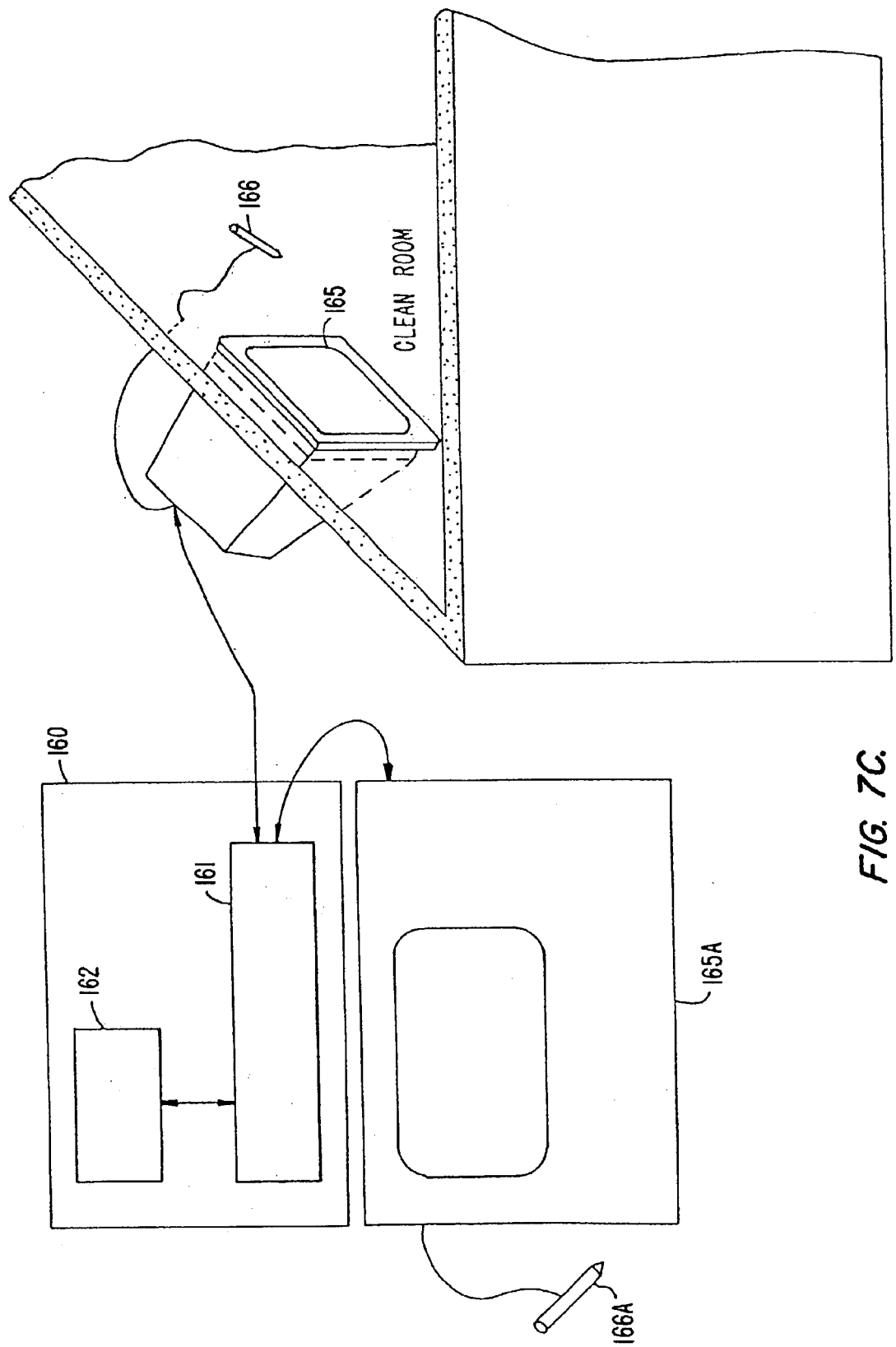
FIG. 7C is a simplified diagram of a monitor and light pen that may be used in conjunction with the exemplary CVD processing chamber of FIG. 7A.

FIG. 7C is an illustration of a portion of an exemplary system user interface used in conjunction with the exemplary CVD processing chamber of FIG. 7A. System controller 160 includes a processor 161 coupled to a computer-readable memory 162. Preferably, memory 162 may be a hard disk drive, but memory 162 may be other kinds of memory, such as ROM, PROM, and others.

System controller 160 operates under the control of a computer program 163 stored in a computer-readable format within memory 162. The computer program dictates the timing, temperatures, gas flows, RF power levels and other parameters of a particular process. The interface between a user and the system controller is via a CRT monitor 165 and a light pen 166, as depicted in FIG. 7C. In a preferred embodiment, two monitors, 165 and 165A, and two light pens, 166 and 166A, are used, one mounted in the clean room wall (165) for the operators and the other behind the wall (165A) for the service technicians. Both monitors simultaneously display the same information, but only one light pen (e.g. 166) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 7D:
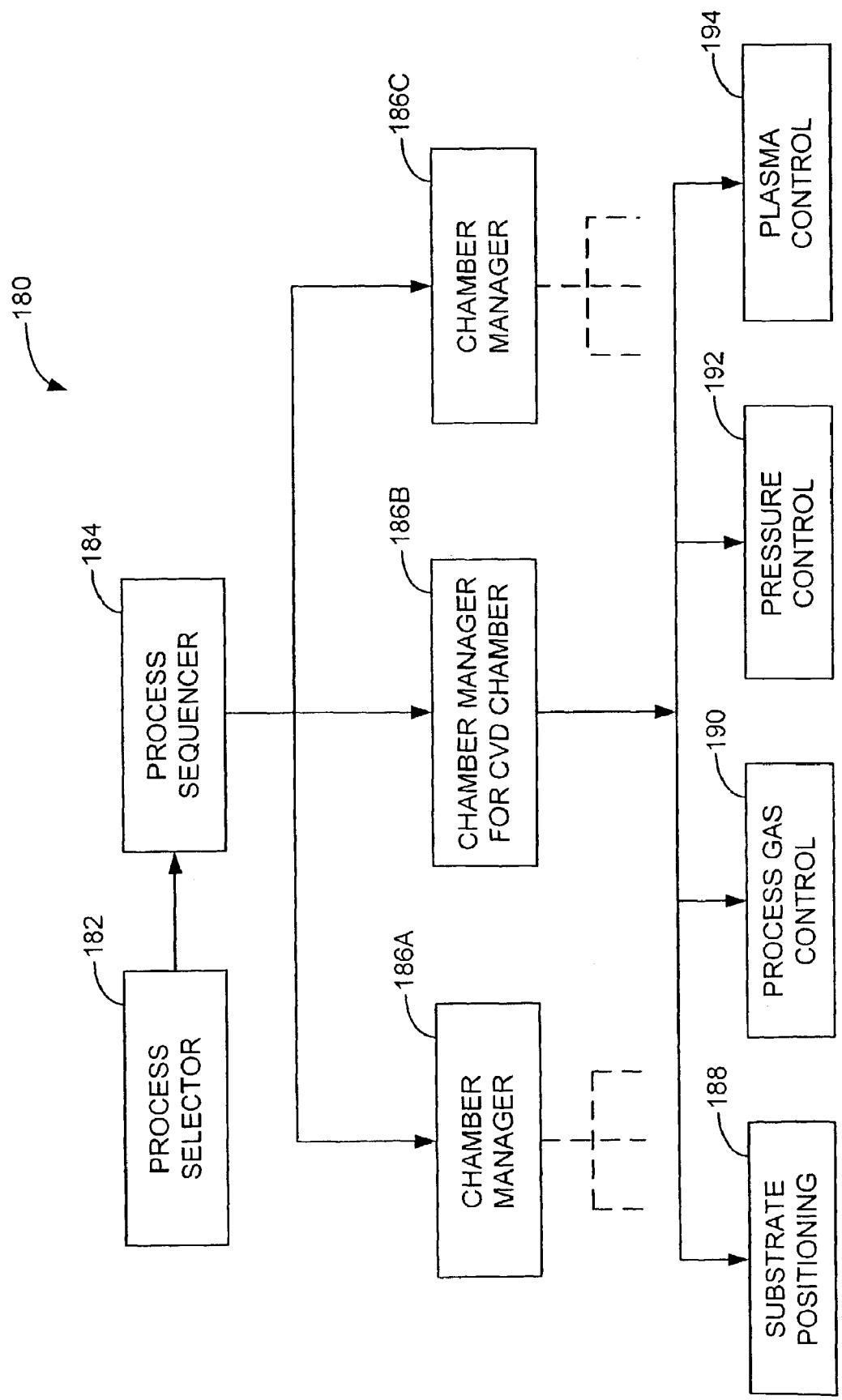
FIG. 7D is a flow chart of an exemplary process control computer program product used to control the exemplary CVD processing chamber of FIG. 7A.

FIG. 7D shows an illustrative block diagram of the hierarchical control structure of computer program 180. A user enters a process set number and process chamber number into a process selector subroutine 182 in response to menus or screens displayed on the CRT monitor by using the light pen interface. The process sets are predetermined sets of process parameters necessary to carry out specified processes, and are identified by predefined set numbers. Process selector subroutine 182 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 160, and the signals for controlling the process are output on the analog and digital output boards of system controller 160.

A process sequencer subroutine 184 comprises program code for accepting the identified process chamber and set of process parameters from the process selector subroutine 182 and for controlling operation of the various process chambers. Multiple users can enter process set numbers and process chamber numbers, or a single user can enter multiple process set numbers and process chamber numbers; sequencer subroutine 184 schedules the selected processes in the desired sequence. Preferably, sequencer subroutine 184 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 184 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 184 determines which process chamber and process set combination is going to be executed next, sequencer subroutine 184 initiates execution of the process set by passing the particular process set parameters to a chamber manager subroutine 186A–C, which controls multiple processing tasks in chamber 113 and possibly other chambers (not shown) according to the process set sent by sequencer subroutine 184.

Examples of chamber component subroutines are substrate positioning subroutine 188, process gas control subroutine 190, pressure control subroutine 192, and plasma control subroutine 194. Those having ordinary skill in the art will recognize that other chamber control subroutines can be included depending on what processes are selected to be performed in chamber 113. In operation, chamber manager subroutine 186B selectively schedules or calls the process component subroutines in accordance with the particular process set being executed. Chamber manager subroutine 186B schedule process component subroutines in the same manner that sequencer subroutine 184 schedules the process chamber and process set to execute. Typically, chamber manager subroutine 186B includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 7A and 7D. Substrate positioning subroutine 188 comprises program code for controlling chamber components that are used to load a substrate onto substrate support number 118. Substrate positioning subroutine 188 may also control transfer of a substrate into chamber 113 from, e.g., a PECVD reactor or other reactor in the multi-chamber system, after other processing has been completed.

Process gas control subroutine 190 has program code for controlling process gas composition and flow rates. Subroutine 190 controls the open/close position of the safety shut-off valves and also ramps up/ramps down the mass flow controllers to obtain the desired gas flow rates. All chamber component subroutines, including process gas control subroutine 190, are invoked by chamber manager subroutine 186B. Subroutine 190 receives process parameters from chamber manager subroutine 186B related to the desired gas flow rates.

Typically, process gas control subroutine 190 opens the gas supply lines, and repeatedly (i) reads the necessary mass flow controllers, (ii) compares the readings to the desired flow rates received from chamber manager subroutine 186B, and (iii) adjusts the flow rates of the gas supply lines as necessary. Furthermore, process gas control subroutine 190 may include steps for monitoring the gas flow rates for unsafe rates and for activating the safety shut-off valves when an unsafe condition is detected.

In some processes, an inert gas, such as argon, is flowed into chamber 113 to stabilize the pressure in the chamber before reactive process gases are introduced. For these processes, the process gas control subroutine 190 is programmed to include steps for flowing the inert gas into chamber 113 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 190 may include steps for bubbling a delivery gas such as helium through the liquid precursor in a bubbler assembly or for introducing the helium to a liquid injection valve. For this type of process, the process gas control subroutine 190 regulates the flow of the delivery gas, the pressure in the bubbler, and the bubbler temperature to obtain the desired process gas flow rates. As discussed above, the desired process gas flow rates are transferred to process gas control subroutine 190 as process parameters.

Furthermore, the process gas control subroutine 190 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 190 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 192 includes program code for controlling the pressure in chamber 113 by regulating the size of the opening of throttle valve 126 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 126 to a fixed position. Setting throttle valve 126 to a fixed position may eventually result in a steady-state pressure.

Alternatively, the chamber pressure may be measured, with a manometer for example, and the position of throttle valve 126 may be adjusted according to pressure control subroutine 192, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 192 is invoked, the desired, or target, pressure level is received as a parameter from chamber manager subroutine 186B. Pressure control subroutine 192 measures the pressure in chamber 113 by reading one or more conventional pressure manometers connected to the chamber; compares the measured value(s) to the target pressure; obtains proportional, integral, and differential (PID) values from a stored pressure table corresponding to the target pressure, and adjusts throttle valve 126 according to the PID values obtained from the pressure table. Alternatively, pressure control subroutine 192 may open or close throttle valve 126 to a particular opening size to regulate the pressure in chamber 113 to a desired pressure or pressure range.

Plasma control subroutine 194 comprises program code for controlling the frequency and power output setting of RF generators 131A and 131B and for tuning matching networks 132A and 132B. Plasma control subroutine 194, like the previously described chamber component subroutines, is invoked by chamber manager subroutine 186B.

An example of a system that may incorporate some or all of the subsystems and routines described above would be the ULTIMA™ system, manufactured by APPLIED MATERIALS, INC., of Santa Clara, Calif., configured to practice the present invention. The described system is for exemplary purpose only. It would be a matter of routine skill for a person of skill in the art to select an appropriate conventional substrate processing system and computer control system to implement the present invention. The gas flow rates, RF values and other parameters discussed above are based on processes employed in an Ultima HDP-CVD chamber outfitted for 8-inch wafers. These values are in part chamber specific and may vary if chambers of other design and/or volume are used.

Having fully described several embodiments of the present invention, other equivalent or alternative methods of practicing the present invention will be apparent to those skilled in the art. For example, while the invention was described as being particularly useful when an IC requires an IMD layer deposited over aluminum lines having aluminum fluoride residue thereon it is also useful when IC 10 includes metal lines other than aluminum and those lines have metal fluoride residue. Furthermore, the invention may provide throughput benefits when used as a seasoning film for premetal dielectric and shallow trench isolation applications. In these applications, a silicon seasoning film can be considerably thinner than a silicon oxide seasoning film while providing the same amount of protection against contaminant diffusion. Thus, the thinner film can be deposited in less time than the thicker film. Additionally, removal of the silicon seasoning film during the chamber clean step proceeds faster due to its higher etch rate (generally 3–4 times higher than silicon oxide) to fluorine clean chemistries and its thickness. Accordingly, while the present invention has been disclosed in connection with the embodiments described above, it should be understood that other embodiments may fall within the spirit and scope of the invention, as defined by the following claims.

What is claimed is:

1. A method of operating a substrate processing chamber, said method comprising:

prior to a substrate processing operation and prior to transferring a substrate into the substrate processing chamber, forming a protective layer over an interior surface of said substrate processing chamber, the protective layer comprising a layer of silicon and a layer of silicon oxide formed over the layer of silicon.

2. The method of claim 1 further comprising:

transferring a substrate into said substrate processing chamber after forming said protective layer; and processing said substrate in said substrate processing chamber.

3. The method of claim 2 wherein said processing comprises depositing a dielectric layer over said substrate.

4. The method of claim 3 wherein said dielectric layer comprises a silicon oxide layer.

5. The method of claim 4 wherein said silicon oxide layer is a fluorosilicate glass layer.

6. The method of claim 1 wherein said layer of silicon is deposited from a plasma of a first seasoning gas, said first seasoning gas comprising a silane gas having a formula of $Si_nH_{2n+2}$ and said plasma has a density of at least $1 \times 10^{11}$ ions/cm$^3$ where n is an integer greater than or equal to 1.

7. The method of claim 6 wherein said layer of silicon is deposited from a plasma of a first seasoning gas, said first seasoning gas comprising a silane gas having a formula of $Si_nH_{2n+2}$ and said plasma has a density of at least $1 \times 10^{11}$ ions/cm$^3$ where n is an integer greater than or equal to 1.

8. A method of operating a substrate processing chamber, said method comprising:

prior to a substrate processing operation, forming over an interior surface of said substrate processing chamber a protective layer comprising a layer of silicon and a layer of silicon oxide formed over the layer of silicon;

transferring a substrate into said substrate processing chamber after forming said silicon layer, wherein said substrate includes an aluminum layer formed thereon and wherein an outer strata of said aluminum layer comprises aluminum fluoride; and processing said substrate in said substrate processing chamber to deposit a dielectric layer over said substrate.

9. The method of claim 8 wherein said outer strata is at least 10 Å thick.

10. The method of claim 8 wherein said outer strata is less than or equal to 200 Å thick.

* * * * *